United States Patent
Oishi (10) Patent No.: US 6,182,259 B1
(45) Date of Patent: Jan. 30, 2001

(54) PROGRAM FOR ERROR CORRECTING PROCESS INCLUDED IN ERROR CORRECTING DEVICE, METHOD, AND MEDIUM

(75) Inventor: Akihiro Oishi, Kunitachi (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/969,062

(22) Filed: Nov. 12, 1997

(30) Foreign Application Priority Data

Nov. 13, 1996 (JP) .................................................. 8-301833

(51) Int. Cl.⁷ .................................................. H03M 13/00
(52) U.S. Cl. .......................................................... 714/752
(58) Field of Search ..................................... 714/752, 753, 714/755, 757, 754, 758

(56) References Cited

U.S. PATENT DOCUMENTS

| | | | |
|---|---|---|---|
| 4,602,295 | * 7/1986 | Moriyama et al. | 358/343 |
| 4,852,102 | * 7/1989 | Yamaguchi | 371/40 |
| 4,881,232 | * 11/1989 | Sako et al. | 371/37.4 |
| 4,928,280 | * 5/1990 | Nielson et al. | 371/39.1 |
| 5,068,855 | * 11/1991 | Kashida et al. | 371/37.4 |
| 5,228,041 | * 7/1993 | Yoshino et al. | 371/47.1 |
| 5,267,248 | * 11/1993 | Reyner | 371/25.1 |
| 5,570,378 | * 10/1996 | Inoue et al. | 371/37.1 |

FOREIGN PATENT DOCUMENTS 10-145238 * 5/1998 (JP) .............................. H03M/13/00

* cited by examiner

*Primary Examiner*—Albert De Cady
*Assistant Examiner*—Samuel Lin
(74) *Attorney, Agent, or Firm*—Fitzpatrick, Cella, Harper & Scinto (57) ABSTRACT

First and second digital data to which a code to correct errors was added are inputted. For a certain period of time, processes to detect errors in the first and second digital data are executed in accordance with the order of the first digital data and the second digital data. In this period of time, on the basis of the processing results, processes to correct the errors in the first and second digital data are executed in accordance with the order of the second digital data and the first digital data. Thus, the error detecting processes of the digital data that is inputted on a predetermined unit basis can be executed in parallel and an error correcting process in which a circuit scale is small and costs are low can be realized.

28 Claims, 9 Drawing Sheets

PROGRAM FOR ERROR CORRECTING PROCESS INCLUDED IN ERROR CORRECTING DEVICE, METHOD, AND MEDIUM

BACKGROUND OF THE INVENTION

1. Field of the Invention

The invention relates to a program for an error correcting process included in an error correcting device, method, and medium and, more particularly, to a technique for performing an error correcting process to digital data to which a code for detecting and correcting an error was added.

2. Related Background Art

Hitherto, in case of recording or transmitting digital data, it is a general way to add additional data for detecting and correcting errors of the digital data. By checking the additional data at the time of reproduction or reception, an error occurring at the time of recording or reproduction of the digital data or during the transmission can be detected and corrected. A Reed Solomon code which is used as such additional code is excellent in an ability for detecting and correcting an error and is used in many signal processing systems.

Figure 1:
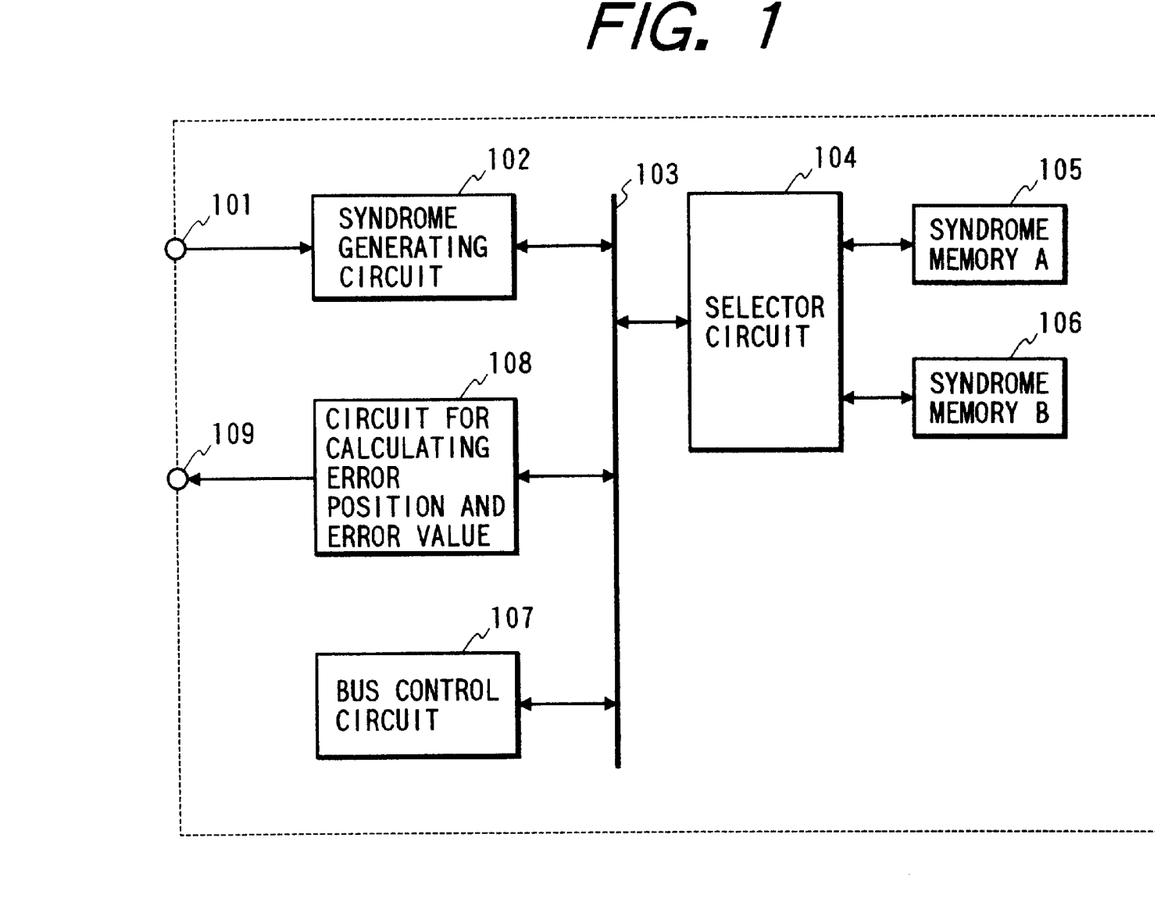
FIG. 1 is a block diagram for explaining a construction of a conventional error correcting device.

FIG. 1 is a block diagram showing a general error detecting processing device using the Reed Solomon code.

In FIG. 1, reference numeral 101 denotes an input terminal; 102 a syndrome generating circuit; 103 a data bus; 104 a selector circuit; 105 a syndrome memory A; 106 a syndrome memory B; 107 a bus control circuit; 108 a circuit for calculating an error position and an error value; and 109 an output terminal.

Digital data of a predetermined unit to which the Reed Solomon code was added is inputted to the syndrome generating circuit 102 through the input terminal 101. The syndrome generating circuit 102 generates a syndrome on the basis of the Reed Solomon code of the digital data of each unit. After the syndrome of the digital data of each unit was generated, it is inputted to the selector circuit 104 via the data bus 103 while being controlled by the bus control circuit 107. The selector circuit 104 alternately records the syndromes of the digital data into the syndrome memory A 105 or syndrome memory B 106 on a predetermined unit basis.

The syndromes of the digital data recorded in the syndrome memory A 105 or syndrome memory B 106 are alternately read out by the selector circuit 104 while being controlled by the bus control circuit 107 and are inputted to the error position and error value calculating circuit 108 through the data bus 103. The error position and error value calculating circuit 108 executes an Euclidean method, a chain search, or the like to the syndromes generated from the digital data of a predetermined unit, thereby calculating the error position and the error value. Arithmetic operation results are outputted from the output terminal 109 and the errors are corrected by an error correcting circuit (not shown).

As mentioned above, in case of detecting and correcting the error of the digital data by using, for example, the Reed Solomon code, it is generally necessary to sequentially perform a generation of syndromes, a calculation of an error polynomial, a chain search, and a calculation of the error position and the error value. In order to detect and correct the error in the digital data of a predetermined unit every unit, it is necessary to sequentially execute a series of those processes. In the conventional device, the generation of the syndromes of each unit and the calculation of the error position and the error value are alternately processed by using one selector circuit and two syndrome memories.

However, in case of processing two kinds of digital data (for example, digital audio data and digital image data) in parallel by using the conventional device as mentioned above, one selector circuit and two syndrome memories are further necessary. Therefore, for example, in case of processing a motion image with an audio sound, it is necessary to process the digital audio data and the digital image data in parallel within a predetermined period of time, so that there is a drawback such that a circuit scale is large and large costs are required.

SUMMARY OF THE INVENTION

An object of the present invention is to solve the above-described problem.

In an error correcting device, another object of the invention is to realize an error correcting process in which error detecting processes of digital data that is inputted on a predetermined unit basis can be executed in parallel and a circuit scale is small and costs are low.

According to a preferred embodiment of the invention under such objects, there is provided an error correcting device comprising:

(a) input means for inputting first and second digital data to which a code to correct an error is added;

(b) first processing means for performing a process to detect errors in the first and second digital data in accordance with the order of the first digital data and the second digital data for a certain period of time; and (c) second processing means for performing a process to correct the errors in the first and second digital data in accordance with the order of the second digital data and the first digital data on the basis of a processing result of the first processing means for the period of time.

According to another embodiment of the invention, there is provided an error correcting device comprising:

(a) input means for inputting first and second digital data to which a code to correct an error is added;

(b) first processing means for performing a process to detect errors in the first and second digital data;

(c) second processing means for performing a process to correct the errors in the first and second digital data; and (d) control means for controlling so as to further reduce a period of time during which a processing period in which the first processing means executes the process of the first digital data and a processing period in which the second processing means executes the process of the first digital data overlap.

According to still another embodiment of the invention, there is provided an error correcting device comprising:

(a) input means for inputting digital video data and digital audio data;

(b) generating means for generating syndromes of the digital video data and the digital audio data;

(c) calculating means for calculating error positions and error values of the digital audio data and the digital video data; and (d) control means for controlling so that the generating means generates the syndrome of the digital audio data for a processing period of time during which the calculating means calculates the error position and the error value of the digital video data.

In an error correcting method, further another object of the invention is to realize an error correcting process in which error detecting processes of digital data that is inputted on a predetermined unit basis can be executed in parallel and a circuit scale is small and costs are low.

According to a preferred embodiment of the invention under such an object, there is provided an error correcting method comprising:
(a) an input step of inputting first and second digital data to which a code to correct an error is added;
(b) a first processing step of performing a process to detect errors in the first and second digital data in accordance with the order of the first digital data and the second digital data for a certain period of time; and
(c) a second processing step of performing a process to correct the errors in the first and second digital data in accordance with the order of the second digital data and the first digital data on the basis of a processing result derived by the first processing step for the period of time.

According to another embodiment of the invention, there is provided an error correcting method comprising:
(a) an input step of inputting first and second digital data to which a code to correct an error is added;
(b) an error detecting step of detecting errors in the first and second digital data;
(c) an error correcting step of correcting the errors in the first and second digital data; and
(d) a control step of controlling so that a period in which a process of the first digital data is executed in the error detecting step and a process of the first digital data is executed in the error correcting step do not overlap.

According to still another embodiment of the invention, there is provided an error correcting method comprising:
(a) an input step of inputting digital video data and digital audio data;
(b) a generating step of generating syndromes of the digital video data and the digital audio data;
(c) a calculating step of calculating error positions and error values of the digital audio data and the digital video data; and
(d) a control step of controlling so that the syndrome of the digital audio data is generated in the generating step for a processing period of time during which the error position and the error value of the digital video data are calculated by the calculating step.

In a program for an error correcting process included in a medium, further another object of the invention is to realize an error correcting process in which error detecting processes of digital data that is inputted on a predetermined unit basis can be executed in parallel and a circuit scale is small and costs are low.

According to a preferred embodiment of the invention under such an object, there is provided a program for an error correcting process included in a medium which can be read out by a computer, comprising:
(a) an input step of inputting first and second digital data to which a code to correct an error is added;
(b) a first processing step of performing a process to detect errors in the first and second digital data in accordance with the order of the first digital data and the second digital data for a certain period of time; and
(c) a second processing step of performing a process to correct the errors in the first and second digital data in accordance with the order of the second digital data and the first digital data on the basis of a processing result derived by the first processing step for the period of time.

Still other objects of the present invention, and the advantages thereof, will become fully apparent from the following detailed description of the embodiments.

DETAILED DESCRIPTION OF THE PREFERRED EMBODIMENTS

The preferred embodiments of the present invention will be described in detail hereinafter with reference to the accompanying drawings.

[First embodiment]

Figure 2:
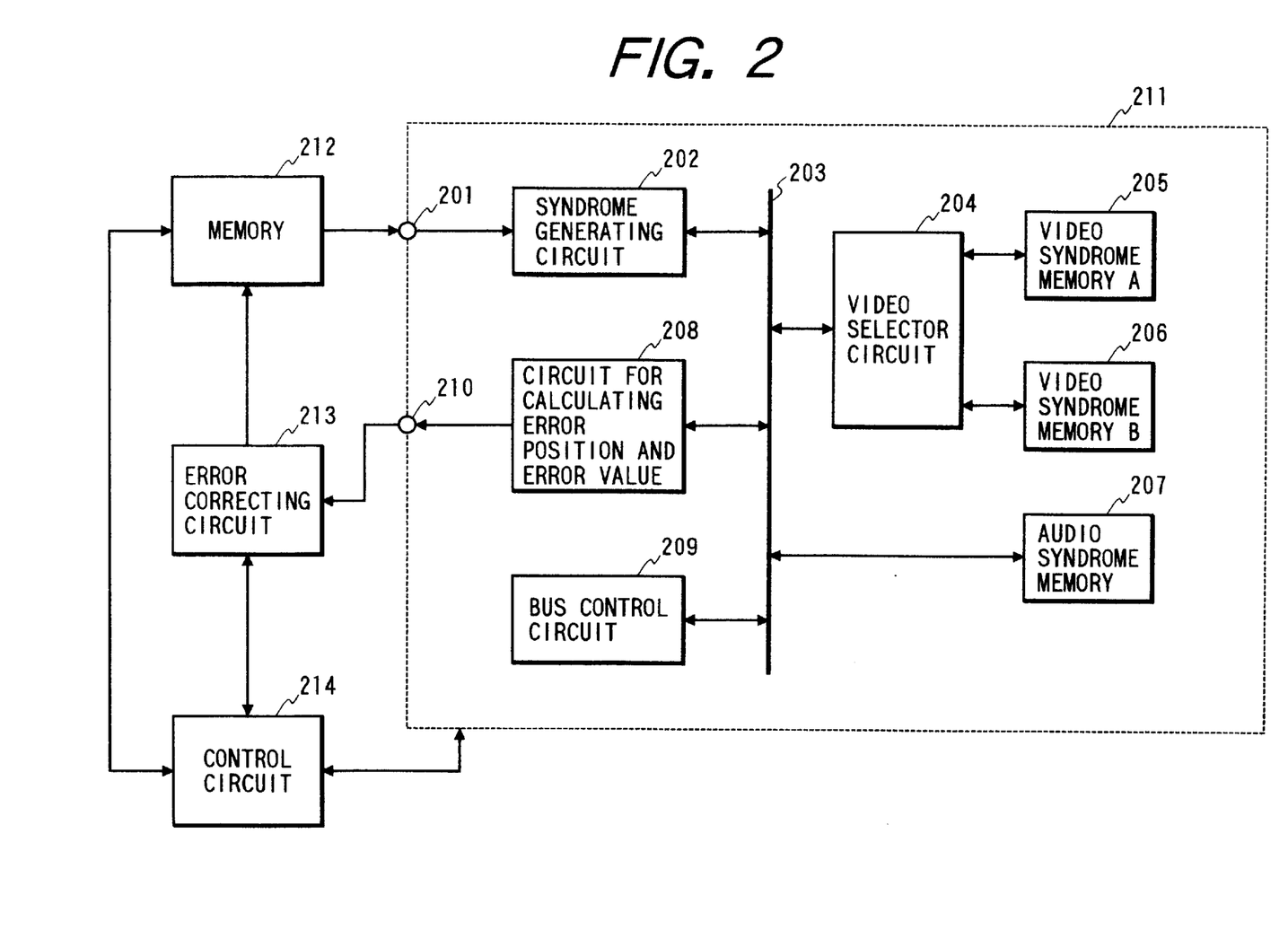
FIG. 2 is a block diagram showing a construction of an error correcting device according to the first embodiment of the invention.

FIG. 2 is a block diagram showing a construction of an error correcting device according to the first embodiment of the present invention.

In FIG. 2, reference numeral 201 denotes an input terminal; 202 a syndrome generating circuit; 203 a data bus; 204 a video selector circuit; 205 a video syndrome memory A; 206 a video syndrome memory B; 207 an audio syndrome memory; 208 a circuit for calculating an error position and an error value; 209 a bus control circuit; and 210 an output terminal.

In FIG. 2, reference numeral 211 denotes an error detecting device constructed by the circuits 201 to 210. The error detecting device 211 calculates an error position and an error value of digital data (to which a code for error detection and correction has been added) inputted from the input terminal 201 and outputs calculation results from the output terminal 210. Reference numeral 212 denotes a memory to store digital video data and digital audio data of a predetermined unit (for example, as much as one track or one picture plane) to which a code (for instance, Reed Solomon product code) to detect and correct the error has been added. The digital video data and digital audio data stored in the memory 212 are alternately read out and supplied to the input terminal 201. The digital data (to which the code for error detection and correction has been added) to be written into the memory 212 is, for example, data that was reproduced from an external recording medium or was inputted from an external transmission path. Reference numeral 213 denotes an error correcting circuit for correcting the errors of the digital video data or digital audio data stored in the memory 212 by using the error positions and the error values of the digital video data or digital audio data as much as one track which was outputted from the output terminal 210. Reference numeral 214 denotes a control circuit for controlling the error detecting device 211, memory 212, and error correcting circuit 213 and for controlling so as to execute calculations to detect and correct the errors in the digital data (in the embodiment, video data and audio data) which is stored into the memory 212 in parallel.

The operation of the error correcting device constructed as mentioned above will now be described hereinbelow.

The digital audio data and digital video data as much as one track or one picture plane inputted from the input terminal 201 are alternately inputted to the syndrome generating circuit 202 and syndromes are generated.

After the syndromes of the digital audio data of one track were generated, they are recorded into the audio syndrome memory 207 on a track unit basis through the data bus 203 while being controlled by the bus control circuit 209.

After the syndromes of the digital video data of one track were generated, they are inputted to the video selector circuit 204 through the data bus 203 while being controlled by the bus control circuit 209. The video selector circuit 204 switches the video syndrome memory A 205 and video syndrome memory B 206 serving as two banks on a track unit basis, thereby allowing the inputted syndromes to be alternately recorded into each bank.

The syndromes of the digital video data of one track recorded in the video syndrome memory A 205 or video syndrome memory B 206 are alternately read out by the video selector circuit 204 and are inputted to the error position and error value calculating circuit 208 through the data bus 203 while being controlled by the bus control circuit 209. The error position and error value calculating circuit 208 calculates the error positions and the error values of the digital video data from the inputted syndromes by using the Euclidean method, chain search, or the like and outputs the calculation results to the output terminal 210.

The error position and the error value of the digital video data calculated by the error detecting device 211 are outputted from the output terminal 210 and inputted to the error correcting circuit 213. The error correcting circuit 213 corrects the error of the digital video data stored in the memory 212 by using the error position and the error value. After completion of the error correcting process of the digital video data of one track stored in the memory 212, the contents in the memory 212 are rewritten to the digital video data of the next track.

After the calculation of the error positions and the error values of the digital video data as much as one track was finished, error positions and error values of the digital audio data are calculated. That is, syndromes of the digital audio data as much as one track recorded in the audio syndrome memory 207 are read out from the audio syndrome memory 207 and are inputted to the error position and error value calculating circuit 208 through the data bus 203 while being controlled by the bus control circuit 209. On the basis of the syndromes of the digital audio data of one track inputted to the error position and error value calculating circuit 208, the calculating circuit 208 calculates the error positions and the error values of the digital audio data from the inputted syndromes by using the Euclidean method, chain search, or the like and outputs the calculation results to the output terminal 210.

The error positions and the error values of the digital audio data calculated by the error detecting device 211 are outputted from the output terminal 210 and inputted to the error correcting circuit 213. The error correcting circuit 213 corrects the error of the digital audio data stored in the memory 212 by using the error position and the error value. After completion of the error correcting process of the digital audio data of one track stored in the memory 212, the contents in the memory 212 are rewritten to the digital audio data of the next track.

As mentioned above, the error correcting device of the embodiment has a construction having one syndrome memory for audio data and two syndrome memories for video data.

Figure 3:
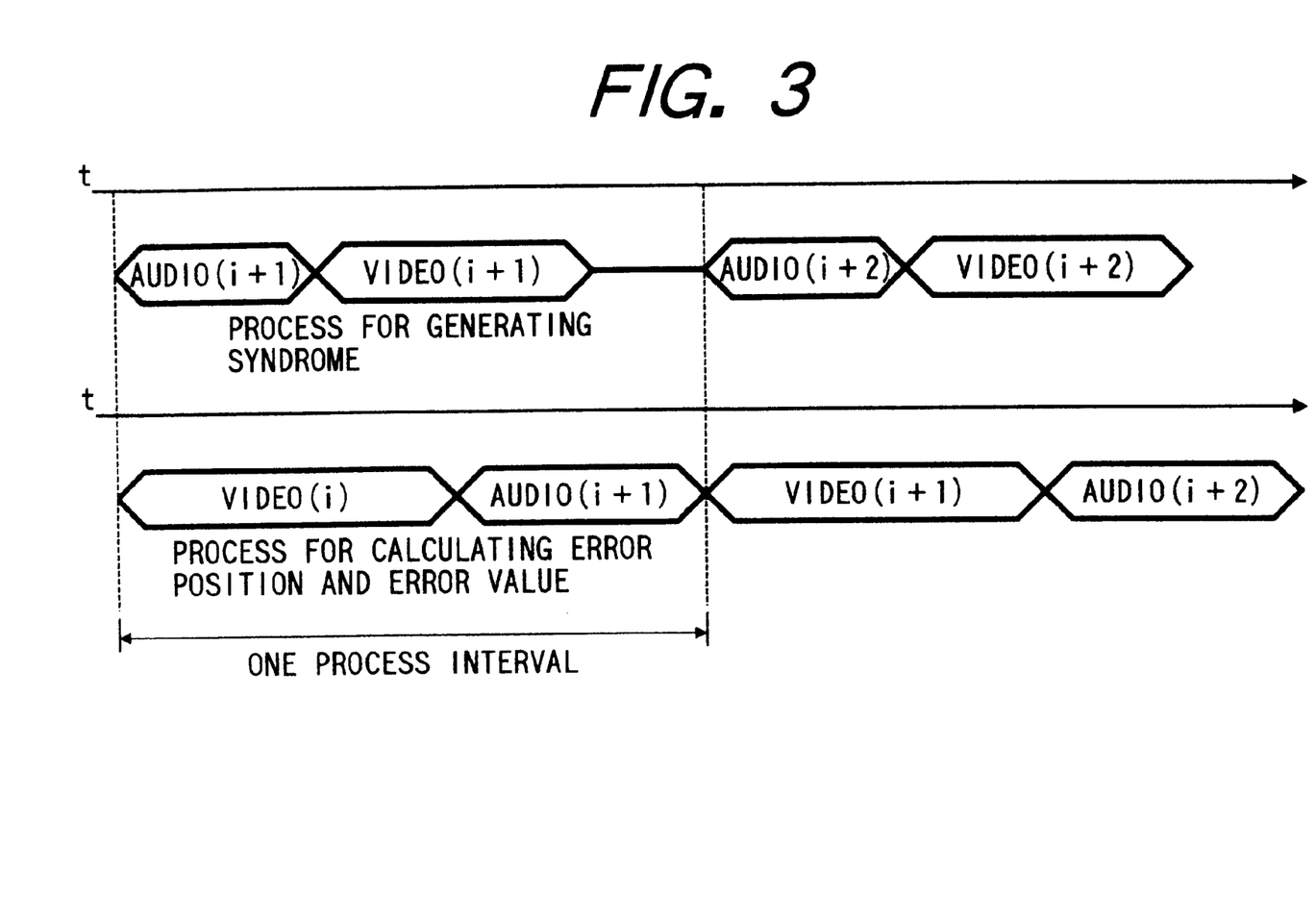
FIG. 3 is a timing chart showing time-dependent flows of a syndrome generating process and an error position and error value calculating process in the error correcting device according to the first embodiment of the invention.

FIG. 3 is an image diagram showing time-dependent flows of the syndrome generating processes and error position and error value calculating processes of the audio data and the video data.

In FIG. 3, the digital audio data of a track unit or a picture plane unit is shown by Audio(0), Audio(1), Audio(i), Audio(i+1), . . . and the digital video data of a track unit or a picture plane unit is shown by Video(0), Video(1), . . . , Video(i), Video(i+1), . . . .

In the embodiment, the syndrome generating process of the audio data and the error position and error value calculating process of the video data are processed in parallel as shown in FIG. 3. In one process interval shown in FIG. 3, the syndrome generating circuit 202 executes the processes in accordance with the order of Audio(i+1) and Video(i+1). At the same time, the error position and error value calculating circuit 208 executes the processes in accordance with the order of Video(i) as data of one track before of Video(i+1) and Audio(i+1) which was subjected to the syndrome generating process during the calculation of the error position and the error value of Video(i).

The error detecting device 211 of the embodiment processes the respective data in parallel by using a point that the time that is required for the error position and error value calculating process and the correcting process of the digital video data is longer than the time that is required for the syndrome generating process of the digital audio data. That is, by performing the error correcting process (syndrome generating process and the error position and error value calculating process) for the digital audio data within one process interval, the number of syndrome memories for audio data can be reduced to one memory.

As mentioned above, according to the first embodiment of the invention, the bus control circuit 209 controls the timings so as to exchange the order of the digital audio data and the digital video data which are supplied to the syndrome generating circuit 202 and error position and error value calculating circuit 208, the number of memories for error detection of the audio data can be reduced to one memory.

[Second embodiment]

Figure 4:
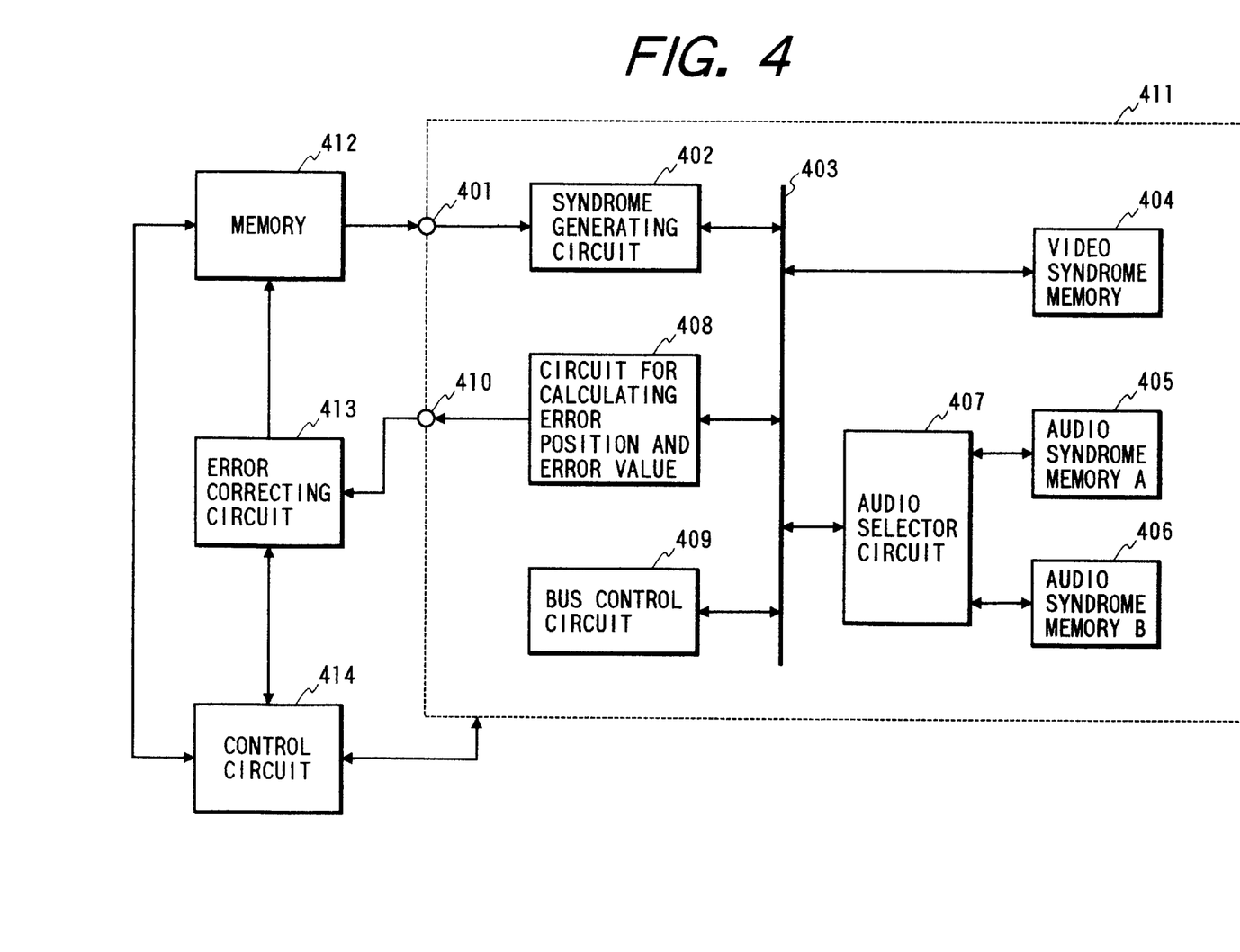
FIG. 4 is a block diagram showing a construction of an error correcting device according to the second embodiment of the invention.

FIG. 4 is a block diagram showing a construction of an error correcting device according to the second embodiment of the invention.

In FIG. 4, reference numeral 401 denotes an input terminal; 402 a syndrome generating circuit; 403 a data bus; 404 a video syndrome memory; 405 an audio syndrome memory A; 406 an audio syndrome memory B; 407 an audio selector circuit; 408 a circuit for calculating an error position and an error value; 409 a bus control circuit; and 410 an output terminal.

In FIG. 4, reference numeral 411 denotes an error detecting device constructed by the circuits 401 to 410. The error detecting device 411 calculates an error position and an error value of digital data (to which a code for error detection and correction has been added) inputted from the input terminal 401 and outputs calculation results from the output terminal 410. Reference numeral 412 denotes a memory to store digital video data and digital audio data of a predetermined unit (for example, as much as one track or one picture plane) to which a code (for instance, Reed Solomon product code) to detect and correct the error has been added. The digital video data and digital audio data stored in the memory 412 are alternately read out and supplied to the input terminal 401. The digital data (to which the code for error detection and correction has been added) to be written into the memory 412 is, for example, data that was reproduced from an external recording medium or was inputted from an external transmission path. Reference numeral 413 denotes an error correcting circuit for correcting the errors of the digital video data or digital audio data stored in the memory 412 by using the error positions and the error values of the digital video data or digital audio data as much as one track which was outputted from the output terminal 410. Reference numeral 414 denotes a control circuit for controlling the error detecting device 411, memory 412, and error correcting circuit 413 and for controlling so as to execute calculations to detect and correct the errors in the digital data (in the embodiment, video data and audio data) which is stored into the memory 412 in parallel.

The operation of the error correcting device constructed as mentioned above will now be described hereinbelow.

The digital audio data and digital video data as much as one track or one picture plane inputted from the input terminal 401 are alternately inputted to the syndrome generating circuit 402 and syndromes are generated.

After the syndromes of the digital audio data of one track were generated, they are inputted to the audio selector circuit 407 through the data bus 403 while being controlled by the bus control circuit 409. The audio selector circuit 407 switches the audio syndrome memory A 405 and audio syndrome memory B 406 serving as two banks on a track unit basis and alternately records the inputted syndromes into each bank.

After the syndromes of the digital video data of one track were generated, they are recorded into the video syndrome memory 404 through the data bus 403 on a track unit basis while being controlled by the bus control circuit 409.

The syndromes of the digital audio data of one track stored in the audio syndrome memory A 405 or audio syndrome memory B 406 are alternately read out by the audio selector circuit 407 and are inputted to the error position and error value calculating circuit 408 through the data bus 403 while being controlled by the bus control circuit 409. The error position and error value calculating circuit 408 calculates the error positions and the error values of the digital audio data from the inputted syndromes by using the Euclidean method, chain search, or the like and outputs the calculation results to the output terminal 410.

The error position and the error value of the digital audio data calculated by the error detecting device 411 are outputted from the output terminal 410 and inputted to the error correcting circuit 413. The error correcting circuit 413 corrects the error of the digital audio data stored in the memory 412 by using the error position and the error value. After completion of the error correcting process of the digital audio data of one track stored in the memory 412, the contents in the memory 412 are rewritten to the digital audio data of the next track.

After the calculation of the error positions and the error values of the digital audio data as much as one track was finished, error positions and error values of the digital video data are calculated. That is, syndromes of the digital video data as much as one track recorded in the video syndrome memory 404 are read out from the video syndrome memory 404 and are inputted to the error position and error value calculating circuit 408 through the data bus 403 while being controlled by the bus control circuit 409. On the basis of the syndromes of the digital video data of one track inputted to the error position and error value calculating circuit 408, the calculating circuit 408 calculates the error positions and the error values of the digital video data from the inputted syndromes by using the Euclidean method, chain search, or the like and outputs the calculation results to the output terminal 410.

The error positions and the error values of the digital video data calculated by the error detecting device 411 are outputted from the output terminal 410 and inputted to the error correcting circuit 413. The error correcting circuit 413 corrects the error of the digital video data stored in the memory 412 by using the error position and the error value. After completion of the error correcting process of the digital video data of one track stored in the memory 412, the contents in the memory 412 are rewritten to the digital video data of the next track.

As mentioned above, the error correcting device of the embodiment has a construction having two syndrome memories for audio data and one syndrome memory for video data.

Figure 5:
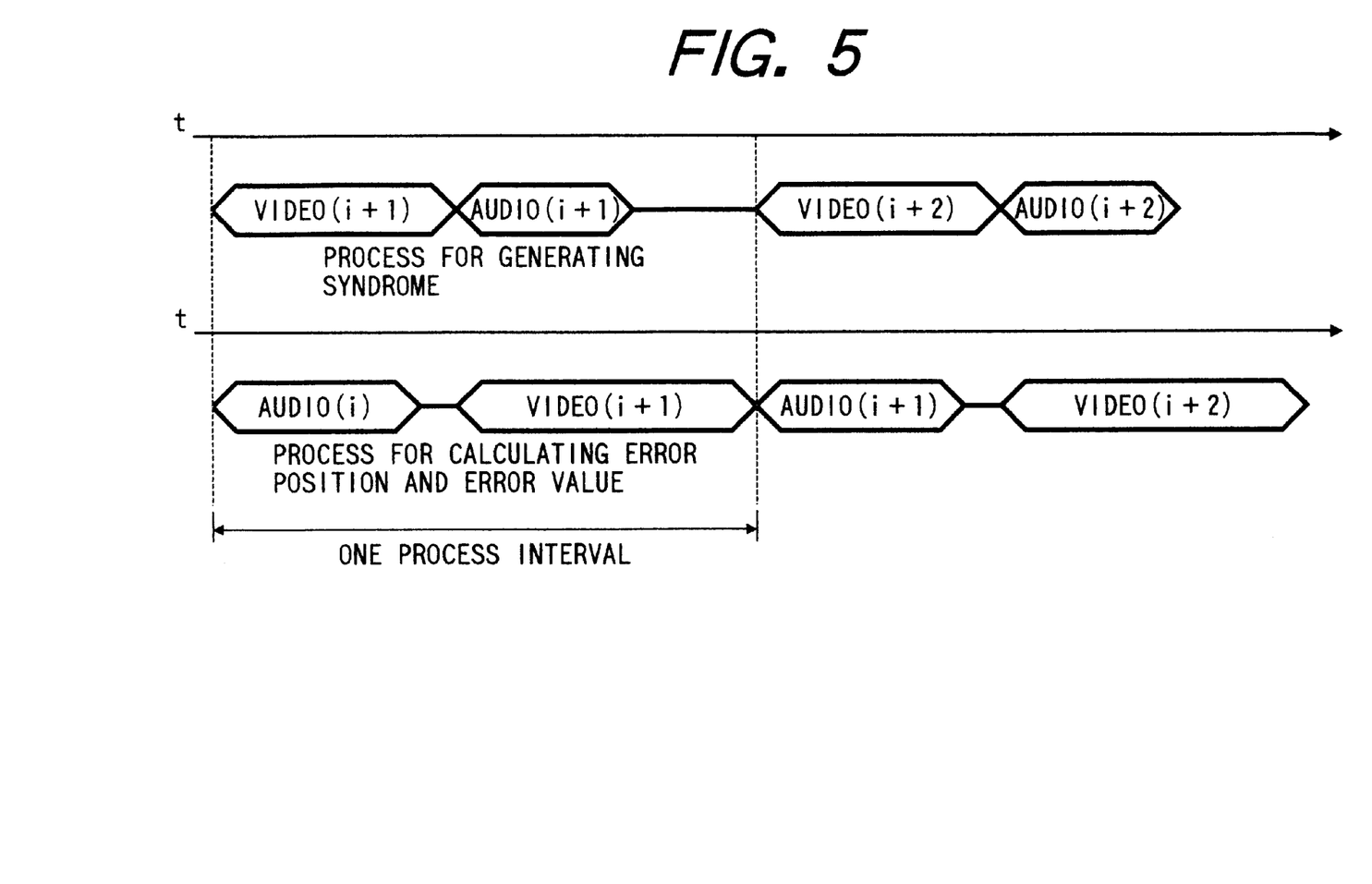
FIG. 5 is a timing chart showing time-dependent flows of a syndrome generating process and an error position and error value calculating process in the error correcting device according to the second embodiment of the invention.

FIG. 5 is an image diagram showing time-dependent flows of the syndrome generating processes and error position and error value calculating processes of the audio data and the video data.

In FIG. 5, the digital audio data of a track unit or a picture plane unit is shown by Audio(0), Audio(1), . . . , Audio(i), Audio(i+1), . . . and the digital video data of a track unit or a picture plane unit is shown by Video(0), Video(1), . . . , Video(i), Video(i+1), . . . ..

In the embodiment, the syndrome generating process of the video data and the error position and error value calculating process of the audio data are processed in parallel as shown in FIG. 5. In one process interval shown in FIG. 5, the syndrome generating circuit 402 executes the processes in accordance with the order of Video(i+1) and Audio(i+1). At the same time, the error position and error value calculating circuit 408 executes the processes in accordance with the order of Audio(i) as data of one track before of Audio(i+1) and Video(i+1) which was subjected to the syndrome generating process during the calculation of the error position and the error value of Audio(i).

In the error detecting device 411 of the embodiment, since the time that is required for the syndrome generating process of the digital video data is longer than the time that is required for the error position and error value calculating process and the correcting process of the digital audio data, the processes are executed so as not to start the error position and error value calculating process of the digital video data [Video(i+1)] until the syndrome generating process of the digital video data [Video(i+1)] is finished. Thus, the error correcting process for the digital video data can be performed within one process interval and the number of syndrome memories for video data can be reduced to one memory.

As mentioned above, according to the second embodiment of the invention, the bus control circuit 409 controls the timings so as to exchange the order of the digital audio data and the digital video data which are supplied to the syndrome generating circuit 402 and error position and error value calculating circuit 408, so that the number of memories for error detection of the video data can be reduced to one memory.

[Third embodiment]

In the error correcting devices (shown in FIGS. 2 and 4) of the first and second embodiments mentioned above, the calculations for detecting and correcting the errors of the digital data stored in the memories (212, 412) have been performed by using various processing circuits. However, the calculating processes shown in the first and second embodiments can be also performed by using a calculating program. In the embodiment, therefore, explanation will now be made with respect to the process such that the errors of the digital video data and digital audio data stored in the memories (212, 412) of the error correcting devices shown in FIGS. 2 and 4 are corrected by using a calculating program. In the embodiment, the calculating program has been stored in recording media provided for the control circuits (214, 414) shown in FIGS. 2 and 4. The control circuits (214, 414) read out and execute the calculating program stored in the recording media, thereby detecting and correcting the errors of the digital data.

Figure 6:
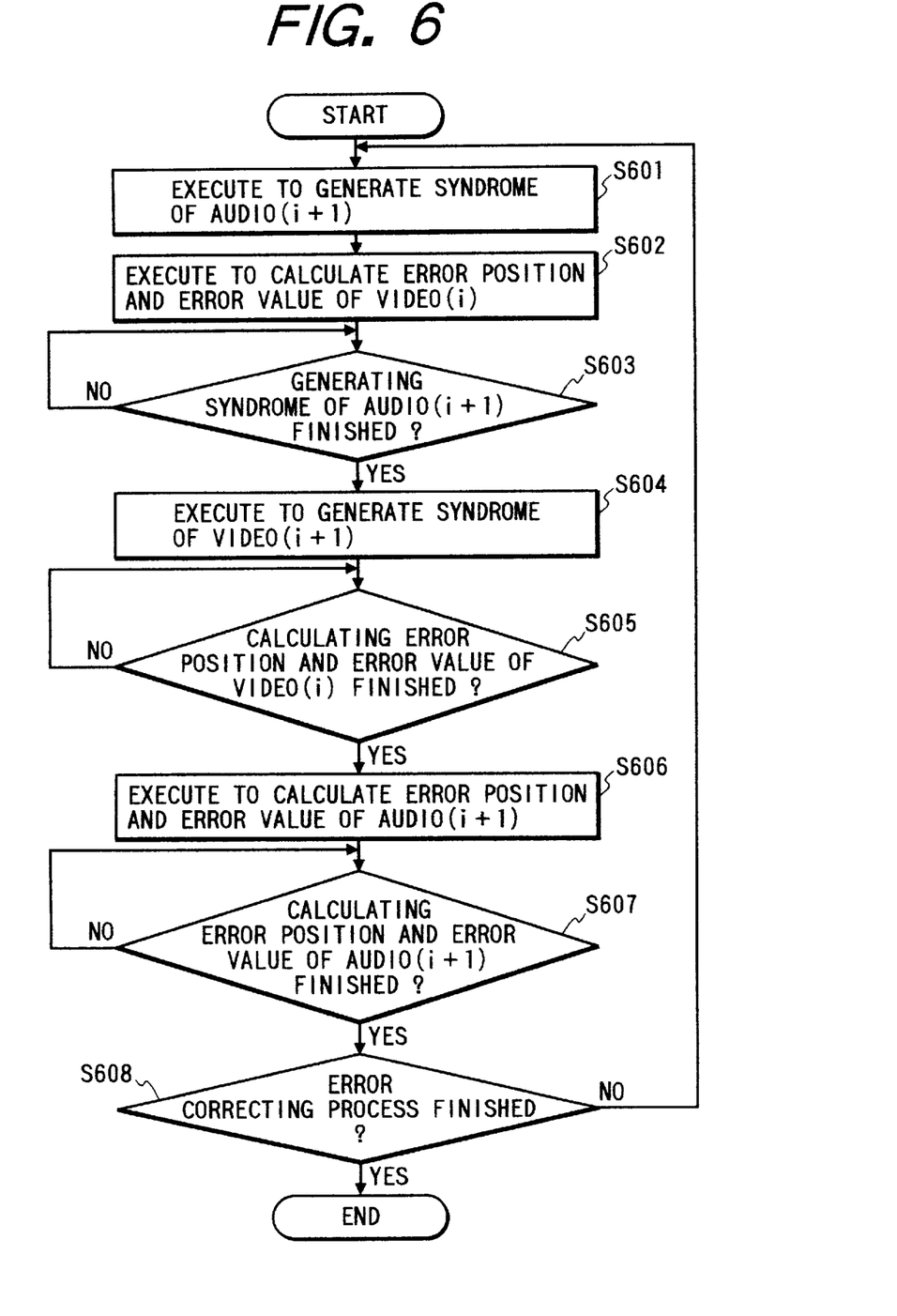
FIG. 6 is a flowchart showing the operation of a control circuit 214 according to the third embodiment.

FIG. 6 is a flowchart showing the operation of the control circuit 214 in the third embodiment.

In FIG. 6, the control circuit 214 reads out the digital audio data [Audio(i+1)] as much as one track stored in the memory 212 and execute the generation of syndromes (step S601). Subsequently, the control circuit 214 reads out the digital video data [Video(i)] of an amount of one track before in which the generation of the syndromes has already been finished from the video syndrome memory A 205 and executes the calculation of the error position and the error value (step S602).

The control circuit 214 discriminates whether the syndromes of the digital audio data [Audio(i+1)] have been generated or not (step S603). When the syndromes are generated, the generation result is stored into the audio syndrome memory 207. After the syndromes of [Audio(i+1)] were generated, the control circuit 214 reads out the digital video data [Video(i+1)] as much as one track stored in the memory 212 and executes the generation of the syndromes (step S604). The syndromes of [Video(i+1)] are stored into the video syndrome memory B 206.

The control circuit 214 further discriminates whether the process for calculating the error position and the error value of the digital video data [Video(i)] has been finished or not (step S605). If YES, the control circuit 214 corrects the errors of [Video(i)] by using the calculation results, reads out the syndromes stored in the audio syndrome memory 207, and executes the calculation of the error position and the error value of the digital audio data [Audio(i+1)] (step S606).

After completion of the calculation to obtain the error position and the error value of the digital audio data [Audio(i+1)] (step S607), the control circuit 214 corrects the errors of [Audio(i+1)] and discriminates whether the calculating processes of the digital audio data and digital video data in the next process interval can be executed or not (step S608). If YES, the processes in step S601 and subsequent steps are repetitively executed. If NO, the control circuit 214 finishes the error correcting process.

By allowing the control circuit 214 to execute the above processes by using the calculating program, the error detecting process for the digital audio data can be executed within one process interval and the number of syndrome memories for audio data can be reduced.

According to the third embodiment of the invention as mentioned above, by replacing the timings for the processes of the digital video data and digital audio data which are stored into the memory 212, the number of syndrome memories for audio data can be reduced and the respective data can be processed in parallel.

Figure 7:
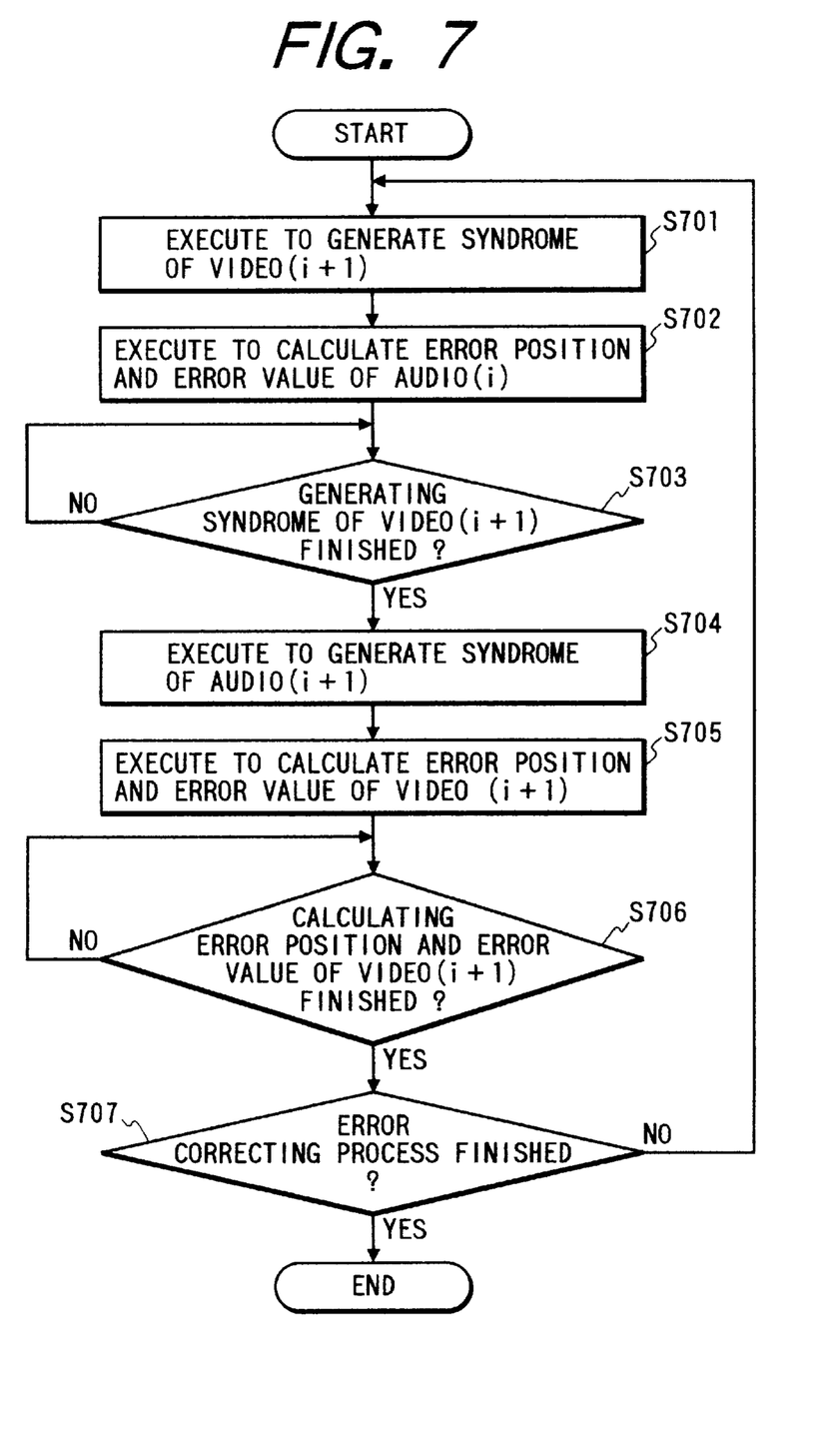
FIG. 7 is a flowchart showing the operation of a control circuit 414 according to the third embodiment.

FIG. 7 is a flowchart showing the operation of the control circuit 414 in the third embodiment.

In FIG. 7, the control circuit 414 reads out the digital video data [Video(i+1)] as much as one track stored in the memory 412 and executes the generation of the syndromes (step S701). Subsequently, the control circuit 414 reads out the digital audio data [Audio(i)] of an amount of one track before in which the generation of the syndromes has already been finished from the audio syndrome memory A 405 and executes the calculation of the error position and the error value (step S702). After completion of the calculation of the error position and the error value of [Audio(i)], the control circuit 414 corrects the errors of [Audio(i)] by using the calculation results.

The control circuit 414 discriminates whether the syndromes of the digital video data [Video(i+1)] have been generated or not (step S703). When the syndromes are generated, the generation result is stored into the video syndrome memory 404. After the syndromes of [Video(i+1)] were generated, the control circuit 414 reads out the digital audio data [Audio(i+1)] as much as one track stored in the memory 412 and executes the generation of the syndromes (step S704). The syndromes of [Audio(i+1)] are stored into the audio syndrome memory B 406.

Subsequently, the control circuit 414 executes the process to calculate the error position and the error value of the digital video data [Video(i+1)] (step S705) and discriminates whether the process has been finished or not (step S706). If YES, the control circuit 414 corrects the errors of [Video(i+1)] by using the calculation results and discriminates whether the calculating processes of the digital audio data and digital video data in the next process interval can be executed or not (step S707). If YES, the processes in step S701 and subsequent steps are repetitively executed. If NO, the control circuit 414 finishes the error correcting process.

By allowing the control circuit 414 to execute the above processes by using the calculating program, the error detecting process for the digital video data can be executed within one process interval and the number of syndrome memories for video data can be reduced.

According to the third embodiment of the invention as mentioned above, by exchanging the timings for the processes of the digital video data and digital audio data which are stored into the memory 412, the number of syndrome memories for video data can be reduced and the respective data can be processed in parallel.

[Fourth embodiment]

The error correcting device shown in the foregoing first, second, and third embodiments can be also applied to an image pickup apparatus, a recording and reproducing apparatus, a display apparatus, a communicating apparatus, or the like. Therefore, the embodiment will now be described with respect to a case where the error correcting device shown in the first or third embodiment is applied to, for example, the image pickup apparatus.

Figure 8:
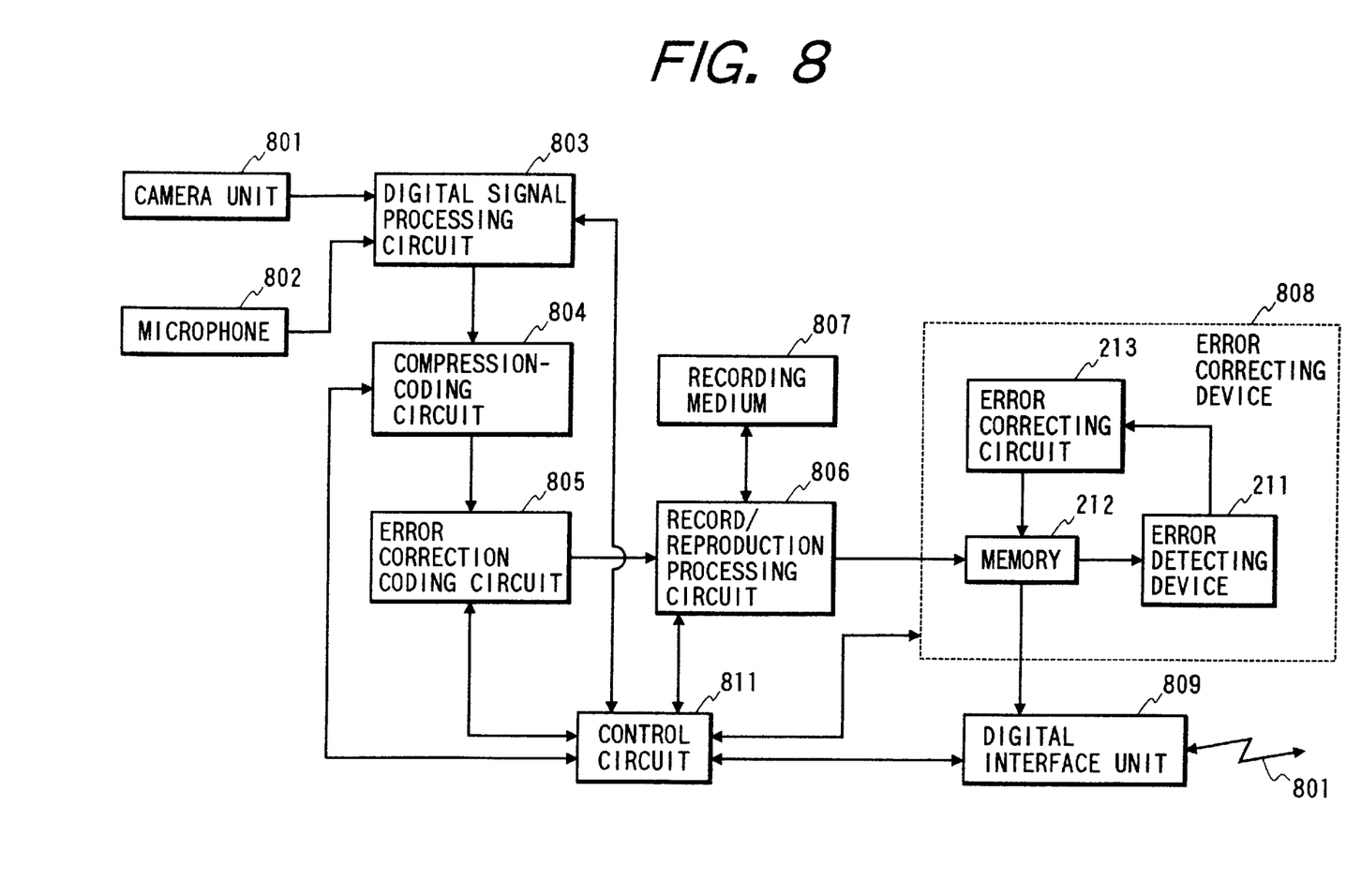
FIG. 8 is a block diagram showing a construction of an image pickup apparatus to which an error correcting device according to the fourth embodiment of the invention is applied.

FIG. 8 is a block diagram showing a construction of an image pickup apparatus having an error correcting device of the embodiment. As an error correcting device of the embodiment, the error correcting device shown in FIG. 2 is used.

In FIG. 8, reference numeral 801 denotes a camera unit which is constructed by a lens, an image pickup device, and the like and generates an electric signal from an optical image of a photographed object; 802 a microphone for collecting external sounds; 803 a digital signal processing circuit for converting the electric signal generated from the camera unit 801 into a digital signal and further converting it to a video signal of a predetermined standard television system (NTSC system, PAL system, or the like). The digital signal processing circuit 803 converts the signal generated from the microphone 802 into a digital signal and further converting it into an audio signal of a predetermined form.

Reference numeral 804 denotes a compression-coding circuit for compression-coding the video signal and audio signal outputted from the digital signal processing circuit 803 by using a predetermined compression-coding system (JPEG system, MPEG system, or the like); 805 an error correcting coding circuit for adding a code (for example, Reed Solomon product code) to detect and correct errors to the video data and audio data which were compression-coded by the compression-coding circuit 804; and 806 a record/reproduction processing circuit for recording and reproducing an output of the error correcting coding circuit 805 to/from a recording medium 807. The recording medium 807 is a medium such as magnetic tape, magnetic disk, or the like which can be recorded and reproduced.

Reference numeral 808 denotes the error correcting device shown in FIG. 2. The error correcting device 808 is constructed by the error detecting device 211, memory 212, and error correcting circuit 213. The error correcting device 808 stores the digital video data and digital audio data reproduced by the record/reproduction processing circuit 806 into the memory 212, detects errors of each data by the error detecting device 211, and corrects them by the error correcting circuit 213. The error correcting process which is executed by the error detecting device 211, memory 212, and error correcting circuit 213 is executed in a manner similar to the first embodiment.

Reference numeral 809 denotes a digital interface unit for converting the digital data whose errors were corrected by the error correcting device 808 into data of a predetermined transmission packet form and for outputting to external electronic equipment through a transmission path 810 (for example, a wire transmission path such as a serial bus or the like, a radio transmission path). The digital interface unit 809 is constructed so as to transfer the digital video data and digital audio data by using a function (namely, function to guarantee a synchronous transfer) to guarantee that a pre-determined amount of packets are transmitted and received at every predetermined communicating cycle period, for example, like the IEEE1394 standard. The digital interface unit 809 can be also constructed so that it can communicate with external electronic equipment by using an infrared communicating system such as an IrDA system or the like.

Reference numeral 811 denotes a control circuit which includes a microcomputer and controls the operation of each of the processing circuits (801 to 810) of the image pickup apparatus shown in FIG. 8.

By constructing as mentioned above, the image pickup apparatus shown in FIG. 8 can correct the errors of the digital data (video data and audio data) reproduced from the recording medium 807 by using the error correcting device 808 and can communicate it with the outside via the digital interface unit 809.

According to the fourth embodiment of the invention as mentioned above, by using the error correcting device shown in FIG. 2 for the image pickup apparatus, the number of memories for error correcting process in the image pickup apparatus can be reduced and the error correcting processes of the digital video data and digital audio data can be processed in parallel.

The image pickup apparatus of the embodiment executes the error correcting process of the digital data by using the error correcting device shown in FIG. 2. However, similar processes can be also executed even by a method whereby the image pickup apparatus stores the calculating program shown in the third embodiment into a recording medium provided for the control circuit 811 and the control circuit 811 executes the calculating program.

[Fifth embodiment]

The error correcting device shown in the foregoing first, second, and third embodiments can be also applied to an image pickup apparatus, a recording and reproducing apparatus, a display apparatus, a communicating apparatus, or the like. Therefore, the embodiment will now be described with respect to a case where the error correcting device shown in the second or third embodiment is applied to, for example, the display apparatus.

Figure 9:
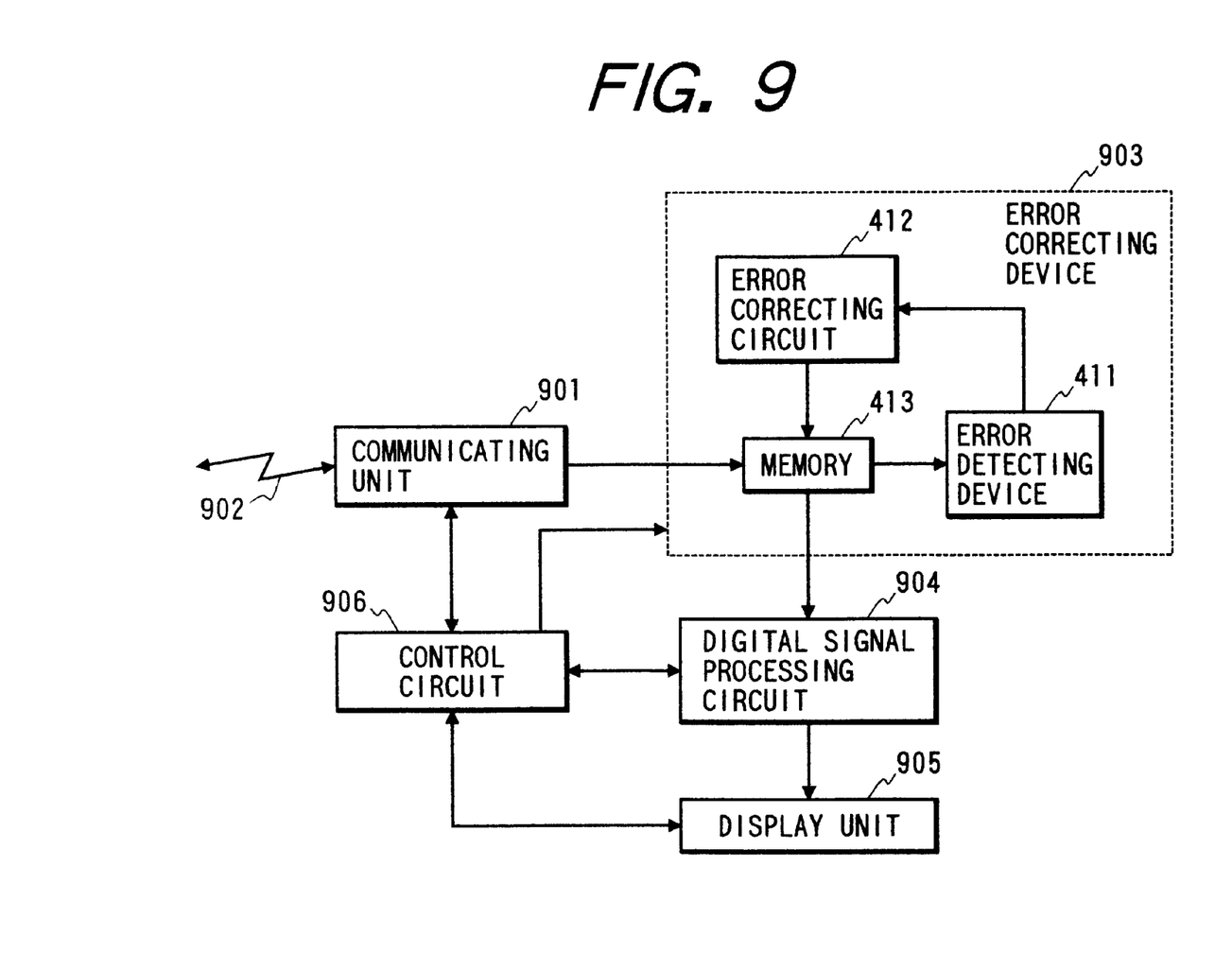
FIG. 9 is a block diagram showing a construction of a display apparatus to which an error correcting device according to the fifth embodiment of the invention is applied.

FIG. 9 is a block diagram showing a construction of a display apparatus having the error correcting device of the embodiment. The error correcting device shown in FIG. 4 is used as an error correcting device of the embodiment.

In FIG. 9, reference numeral 901 denotes a communicating unit for receiving packet data transmitted through a transmission path 902 (for example, a wire transmission path such as a serial bus or the like, a radio transmission path). The communicating unit 901 is constructed so as to receive a predetermined amount of packets (including the digital video data and digital audio data) which are synchronously transferred at every predetermined communicating cycle period, for example, like an IEEE1394 standard. The communicating unit 901 can be also constructed so that it can receive radio data transmitted by using an infrared communicating system such as an IrDA system or the like.

Reference numeral 903 denotes the error correcting device shown in FIG. 4. The error correcting device 903 is constructed by the error detecting device 411, memory 412, and error correcting circuit 413. The error correcting device 903 stores the digital video data and digital audio data received by the communicating unit 901 into the memory 412, detects the errors of each data by the error detecting device 411, and corrects them by the error correcting circuit 413.

Reference numeral 904 denotes a digital signal processing circuit for converting the digital video data and digital audio data whose errors were corrected by the error correcting device 903 into a video signal of a predetermined standard television system (NTSC system, PAL system, or the like). Reference numeral 905 denotes a display unit for displaying the video signal converted by the digital signal processing circuit 904. The display unit 905 is constructed by a liquid crystal panel, a CRT, and the like. Reference numeral 906 denotes a control circuit which includes a microcomputer and controls the operation of each of the processing circuits (901 to 905) of the display apparatus shown in FIG. 9.

By constructing as mentioned above, the display apparatus shown in FIG. 9 can correct the errors of the digital data (video data and audio data) received through the transmission path 902 and can display it via the display unit 905.

According to the fifth embodiment of the invention as mentioned above, by using the error correcting device shown in FIG. 4 for the display apparatus, the number of memories for error correcting process in error correcting device can be reduced and the error correcting processes of the digital video data and digital audio data can be performed in parallel.

Although the display apparatus of the embodiment executes the error correcting process of the digital data by using the error correcting device shown in FIG. 4, similar processes can be also executed by a method whereby the display apparatus stores the calculating program shown in the third embodiment into a recording medium provided for the control circuit 906 and the control circuit 906 executes the calculating program.

The invention may be embodied in other specific forms without departing from the spirit or essential characteristics thereof.

For example, although the embodiments have been described with respect to the error correcting process for correcting the errors of the digital audio data and digital video data, the errors of digital data other than the digital audio data and digital video data can be also corrected.

Although the error correcting device of the embodiments has been described with respect to the processes for executing the calculating program stored in the recording medium provided for the control circuits (214, 414) and correcting the errors, it will be obviously understood that a case where the OS (operating system) which operates on the control circuits (214, 414), an application program, or the like executes processes similar to those of the calculating program is also incorporated in the embodiments.

Therefore, the above-mentioned embodiments are merely examples in all respects, and must not be construed to limit the invention.

The scope of the present invention is defined by the scope of the appended claims, and is not limited at all by the specific descriptions of this specification. Furthermore, all the modifications and changes belonging to equivalents of the claims are considered to fall within the scope of the present invention.

What is claimed is:

1. An error correcting device comprising:
   (a) input means for inputting digital audio data and digital video data;
   (b) error detecting means for detecting errors in (n+1)-th digital audio data after errors in n-th digital video data are detected; and
   (c) generating means for generating a syndrome of the (n+1)-th digital audio data during a period of time when said error detecting means detects the errors in the n-th digital video data, and for generating a syndrome of (n+1)-th digital video data after the syndrome of the (n+1)-th digital audio data is generated.

2. A device according to claim 1, further comprising:
   one memory for storing the syndrome of the digital audio data and two memories each for storing the syndrome of the digital video data.

3. A device according to claim 1,
   wherein said error correcting device is connected to an image pickup unit.

4. A device according to claim 1, wherein said error correcting device is connected to a display unit.

5. A device according to claim 1, wherein the digital audio data and the digital video data are reproduced from a recording medium.

6. A device according to claim 1, wherein the digital audio data and the digital video data are transferred from an external equipment.

7. An error correcting device comprising:
   (a) input means for inputting digital audio data and digital video data;
   (b) generating means for generating a syndrome of (n+1)-th digital audio data after a syndrome of (n+1)-th digital video data is generated; and
   (c) error detecting means for detecting errors in n-th digital audio data during a period of time when said generating means generates the syndrome of the (n+1)-th digital video data, and for detecting errors in the (n+1)-th digital video data after the errors in the n-th digital audio data are detected.

8. A device according to claim 7, further comprising:
   one memory for storing the syndrome of the digital video data and two memories each for storing the syndrome of the digital audio data.

9. A device according to claim 7,
   wherein said error correcting device is connected to an image pickup unit.

10. A device according to claim 7,
    wherein said error correcting device is connected to a display unit.

11. A device according to claim 7, wherein the digital audio data and the digital video data are reproduced from a recording medium.

12. A device according to claim 7, wherein the digital audio data and the digital video data are transferred from external equipment.

13. An error correcting method comprising:
    (a) an input step of inputting digital audio data and digital video data;
    (b) an error detecting step of detecting errors in (n+1)-th digital audio data after errors in n-th digital video data are detected; and
    (c) a generating step of generating a syndrome of the (n+1)-th digital audio data during a period of time when said error detecting step detects the errors in the n-th digital video data, and for generating a syndrome of (n+1)-th digital video data after the syndrome of the (n+1)-th digital audio data is generated.

14. A method according to claim 13, wherein the syndrome of the digital audio data is stored in one memory and the syndrome of the digital video data is selectively stored in two memories.

15. A method according to claim 13, wherein the digital audio data and the digital video data are reproduced from a recording medium.

16. A method according to claim 13, wherein the digital audio data and the digital video data are transferred from external equipment.

17. An error correcting method comprising:
    (a) an input step of inputting digital audio data and digital video data;
    (b) a generating step of generating a syndrome of (n+1)-th digital audio data after a syndrome of (n+1)-th digital video data is generated; and
    (c) an error detecting step of detecting errors in n-th digital audio data during a period of time when said generating step generates the syndrome of the (n+1)-th digital video data, and for detecting errors in the (n+1)-th digital video data after the errors in the n-th digital audio data are detected.

18. A method according to claim 17, wherein the syndrome of the digital video data is stored in one memory and the syndrome of the digital audio data is selectively stored in two memories.

19. A method according to claim 17, wherein the digital audio data and the digital video data are reproduced from a recording medium.

20. A method according to claim 17, wherein the digital audio data and the digital video data are transferred from external equipment.

21. A program for executing an error correcting method stored in a computer-readable medium, said error correcting method comprising:

(a) an input step of inputting digital audio data and digital video data;

(b) an error detecting step of detecting errors in (n+1)-th digital audio data after errors in n-th digital video data are detected; and (c) a generating step of generating a syndrome of the (n+1)-th digital audio data during a period of time when said error detecting step detects the errors in the n-th digital video data, and of generating a syndrome of (n+1)-th digital video data after the syndrome of the (n+1)-th digital audio data is generated.

22. A program according to claim 21, wherein the syndrome of the digital audio data is stored in one memory and the syndrome of the digital video data is selectively stored in two memories.

23. A program according to claim 21, wherein the digital audio data and the digital video data are reproduced from a recording medium.

24. A program according to claim 21, wherein the digital audio data and the digital video data are transferred from external equipment.

25. A program for executing an error correcting method stored in a computer-readable medium, said error correcting method comprising:

(a) an input step of inputting digital audio data and digital video data;

(b) a generating step of generating a syndrome of (n+1)-th digital audio data after the a syndrome of (n+1)-th digital video data is generated; and (c) an error detecting step of detecting errors in n-th digital audio data during a period of time when said generating step generates the syndrome of the (n+1)-th digital video data, and of detecting errors in the (n+1)-th digital video data after the errors in the n-th digital audio data are detected.

26. A program according to claim 25, wherein the syndrome of the digital video data is stored in one memory and the syndrome of the digital audio data is selectively stored in two memories.

27. A program according to claim 25, wherein the digital audio data and the digital video data are reproduced from a recording medium.

28. A program according to claim 25, wherein the digital audio data and the digital video data are transferred from external equipment.

* * * * *

UNITED STATES PATENT AND TRADEMARK OFFICE
CERTIFICATE OF CORRECTION

PATENT NO. : 6,182,259 B1
DATED : January 30,2 001
INVENTOR(S) : Akihiro Oishi

It is certified that error appears in the above-identified patent and that said Letters Patent is hereby corrected as shown below:

Column 1,
Line 51, "an" should read -- a --.

Column 9,
Line 24, "execute" should read -- executes --.

Column 16,
Line 4, "the" should be deleted.

Signed and Sealed this

Sixth Day of August, 2002

*Attest:*

JAMES E. ROGAN
*Attesting Officer*  *Director of the United States Patent and Trademark Office*